United States Patent [19]
Wixforth

[11] Patent Number: 6,029,324
[45] Date of Patent: Feb. 29, 2000

[54] ACOUSTICAL-ELECTRONIC COMPONENT OPERATING WITH ACOUSTICAL SURFACE WAVES AS WELL AS A TUNABLE DELAY LINE, A RESONATOR AND A SEMICONDUCTOR SENSOR USING THE COMPONENT

[75] Inventor: Achim Wixforth, München, Germany

[73] Assignee: Siemens Aktiengesellschaft, Munich, Germany

[21] Appl. No.: 08/867,117

[22] Filed: Jun. 2, 1997

[30] Foreign Application Priority Data

May 31, 1996 [DE] Germany ............................ 196 22 013

[51] Int. Cl.$^7$ ..................................................... H01L 29/82
[52] U.S. Cl. .............................. 25/416; 333/150; 333/152
[58] Field of Search ..................................... 333/150, 152; 257/416

[56] References Cited

U.S. PATENT DOCUMENTS

| | | | |
|---|---|---|---|
| 3,633,118 | 1/1972 | Means et al. | 330/5.5 |
| 3,662,712 | 5/1972 | Moore et al. | 179/100.41 K |
| 3,663,871 | 5/1972 | Nakanuma et al. | 317/235 R |
| 3,749,984 | 7/1973 | Benyon, Jr. et al. | 317/235 R |
| 3,851,280 | 11/1974 | Staples | 333/30 R |
| 4,005,318 | 1/1977 | Claiborne, Jr. | 307/304 |
| 4,247,903 | 1/1981 | Grudkowski et al. | 364/821 |
| 4,328,473 | 5/1982 | Montress et al. | 333/154 |
| 4,468,639 | 8/1984 | Green et al. | 333/153 |
| 4,990,814 | 2/1991 | Tanski et al. | 310/313 R |
| 5,264,717 | 11/1993 | Grudkowski et al. | 257/245 |
| 5,319,326 | 6/1994 | Fleischmann et al. | 333/150 |

FOREIGN PATENT DOCUMENTS 0 810 724 A3  12/1997  European Pat. Off. .

OTHER PUBLICATIONS

Abstract of U.S. Patent No. 4,016,412 (Stern et al.), dated Apr. 5, 1977.

"Single heterojunction structures for acoustic charge transfer devices", Hayden et al., Materials Science & Engineering B35, 1995, pp. 80–86, Elsevier, Amsterdam.

"Voltage Controlled Monolithic SAW Phase Shifter and Its Application to Frequency Variable Oscillator", Urabe, ISEEE Transactions on Sonics and Ultrasonics, vol. SU–29, No. 5, Sep. 1982, pp. 255–261.

"Large–Scale Monolithic SAW Concolver/Correlator on Silicon" (Motamedi et al.), IEEE Transactions on Sonics and Ultrasonics, vol. SU–32, No. 5, Sep. 1985, pp. 663–669.

"Intergrated Circuit Compatibility Surface Acoustic Wave Devices on Gallium Arsenide" (Grudowski et al.), ISEEE Transactions on Microwave Theory and Techniques, vol. 29, No. 12, Dec. 1981, pp. 1348–1356.

"Surface acoutstic waves on GaAs/Al$_x$Ga$_{1-x}$As heterostructures" (Wixforth et al.), The American Physical Society, Physical Review B, Oct. 1989, pp. 7874–7887

*Primary Examiner*—Mahshid Saadat
*Assistant Examiner*—George C. Eckert, II
*Attorney, Agent, or Firm*—Herbert L. Lerner; Laurence A. Greenberg

[57] ABSTRACT

An acoustical-electronic component operating with acoustical surface waves, includes a piezoelectric substrate in which an acoustical surface wave is guided and enters into interaction with an electron system disposed on the substrate in the travel path of the acoustical surface wave. The electron system is constructed as an electron channel that is tunable in its electrical conductivity by field effect. A tunable delay line, a resonator and a semiconductor sensor use the component.

23 Claims, 3 Drawing Sheets

ACOUSTICAL-ELECTRONIC COMPONENT OPERATING WITH ACOUSTICAL SURFACE WAVES AS WELL AS A TUNABLE DELAY LINE, A RESONATOR AND A SEMICONDUCTOR SENSOR USING THE COMPONENT

BACKGROUND OF THE INVENTION

Field of the Invention

The present invention relates to an acoustical-electronic component that operates with acoustical surface waves, including a piezoelectric substrate in which an acoustical surface wave is guided, and an electron system entering into interaction with the acoustical surface wave. The invention also relates to a tunable delay line, a resonator and a semiconductor sensor using the component.

Fundamental principles of interaction effects between acoustical surface waves and semiconductor electron systems are known from the publication: Physical Review B, Vol. 40, No. 11, Oct. 15, 1989, pp. 7874–78875. In particular, that reference discusses acoustical surface waves on GaAs/$Al_xGa_{1-x}$As heterostructures. Especially the interaction between acoustical surface waves and quasi-two-dimensional inversion electron systems in strong magnetic fields and at low temperatures are investigated. It is pointed out that the interaction between acoustical surface waves and highly mobile quasi-two-dimensional electrons leads to a relaxation mechanism. That interaction is evidenced through strong quantum oscillations both in the surface wave intensity and in the speed of sound, which reflect quantum oscillations in the magnetoconductivity of the quasi-two-dimensional electron system in strong magnetic fields.

Surface wave arrays on GaAs and Si that are compatible with integrated circuitry are known, for instance, from the publication: IEEE Transactions on Microwave Theory and Techniques, Vol. MTT-29, No. 12, Dec. 12, 1981, pp. 1348–1356 or the publication: IEEE Transactions on Sonics and Ultrasonics, Vol. SU-29, No. 5, September 1982, pp. 255–261. Those publications point to the possibility of realizing tunable SW resonators, tunable GaAs SW oscillators, monolithic SW convolvers and asynchronous SW correlators/programmable signal-adapted filters. However, in the first of those references, only high-voltage systems based on Schottky diodes are disclosed, which work at substantially higher, chip-incompatible and VLSI-incompatible voltages. Moreover, the blocking currents that unavoidably occur in that implementation represent a considerable problem in the power limitation of the component. Systems are known from the second of those references, in which a phase shift of the surface wave can be tuned through the voltage-controlled thickness of a depletion layer. However, that involves a volume effect, in which the maximum interaction between the surface wave and the mobile charge carriers is frequency-dependent.

SUMMARY OF THE INVENTION

It is accordingly an object of the invention to provide an acoustical-electronic component operating with acoustical surface waves as well as a tunable delay line, a resonator and a semiconductor sensor using the component, which overcome the hereinafore-mentioned disadvantages of the heretofore-known devices of this general type and in which the components can be operated at low voltages on the order of magnitude of at most a few volts and function with an interaction mechanism independent of the operating frequency.

With the foregoing and other objects in view there is provided, in accordance with the invention, an acoustical-electronic component operating with acoustical surface waves, comprising a piezoelectric substrate in which an acoustical surface wave is guided along a travel path; and an electron system entering into interaction with the acoustical surface wave, the electron system constructed as an electron channel disposed on the piezoelectric substrate in the travel path of the acoustical surface wave and the electron system being tunable in its electrical conductivity by field effect.

In accordance with another feature of the invention, the piezoelectric substrate and the electron channel are combined in a piezoelectric semiconductor structure.

In accordance with a further feature of the invention, the piezoelectric semiconductor structure is formed of a material selected from the group consisting of a binary, ternary or quaternary III–V compound or II–VI compound, a heterostructure or a superlattice structure thereof.

In accordance with an added feature of the invention, the material of the piezoelectric semiconductor structure is GaAs, GaAsP, indium antimonide or indium gallium arsenide.

In accordance with an additional feature of the invention, the piezoelectric substrate and the electron channel are constructed as a hybrid structure including a piezoelectric material and a semiconductor structure.

In accordance with yet another feature of the invention, the semiconductor structure containing the electron channel is constructed on the piezoelectric substrate.

In accordance with yet a further feature of the invention, the piezoelectric substrate is formed of a material selected from the group consisting of lithium tantalate, lithium niobate, quartz and zinc oxide.

In accordance with yet an added feature of the invention, the semiconductor structure containing the electron channel is formed of a material selected from the group consisting of compound semiconductors, silicon, germanium, semiconducting polymers and silicon carbide.

In accordance with yet an additional feature of the invention, the piezoelectric material is applied to the semiconductor structure containing the electron channel.

In accordance with again another feature of the invention, the electron channel controllable in its electrical conductivity by field effect is formed of a semiconductor heterostructure.

In accordance with again a further feature of the invention, the semiconductor heterostructure is formed by semiconductor layers with different band spacing between a valence band and a conduction band.

In accordance with again an added feature of the invention, the semiconductor heterostructure is formed by a gallium arsenide layer and a gallium arsenite layer grown thereon and doped with aluminum.

In accordance with again an additional feature of the invention, the electron channel controllable in its electrical conductivity by field effect is constructed in a MISFET structure.

In accordance with still another feature of the invention, the MISFET structure is formed by a MIS diode.

With the objects of the invention in view there is also provided a tunable delay line operating with acoustical surface waves, comprising a component having a piezoelectric substrate, an input and an output interdigital transducer on the piezoelectric substrate, and an electron channel disposed between the interdigital transducers and tunable in its electrical conductivity by field effect.

With the objects of the invention in view there is additionally provided a voltage sensor, comprising a tunable delay line operating with acoustical surface waves and including a component having a piezoelectric substrate, an input and an output interdigital transducer on the piezoelectric substrate, and an electron channel disposed between the interdigital transducers and tunable in its electrical conductivity by field effect.

With the objects of the invention in view there is further provided a frequency-determining element in a voltage-controlled oscillator, comprising a tunable delay line operating with acoustical surface waves and including a component having a piezoelectric substrate, an input and an output interdigital transducer on the piezoelectric substrate, and an electron channel disposed between the interdigital transducers and tunable in its electrical conductivity by field effect.

With the objects of the invention in view there is also provided a resonator operating with acoustical surface waves, comprising a component having at least one interdigital transducer and at least one reflector defining a travel path of an acoustical surface wave between the interdigital transducer and the reflector, and an electron channel disposed in the travel path and tunable in its electrical conductivity by field effect.

With the objects of the invention in view there is additionally provided a resonator operating with acoustical surface waves, comprising a component including a first element having at least one interdigital transducer, and a second element having a reflector, at least one of the first and second elements being at least partially formed of an electron system tunable in its electrical conductivity.

With the objects of the invention in view there is also provided a semiconductor sensor having an acoustical-electronic component operating with acoustical surface waves, wherein the electron channel tunable in its electrical conductivity by field effect and/or the substrate guiding the acoustical surface wave is utilized as a structure responding to a variable to be detected.

Other features which are considered as characteristic for the invention are set forth in the appended claims.

Although the invention is illustrated and described herein as embodied in an acoustical-electronic component operating with acoustical surface waves as well as a tunable delay line, a resonator and a semiconductor sensor using the component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
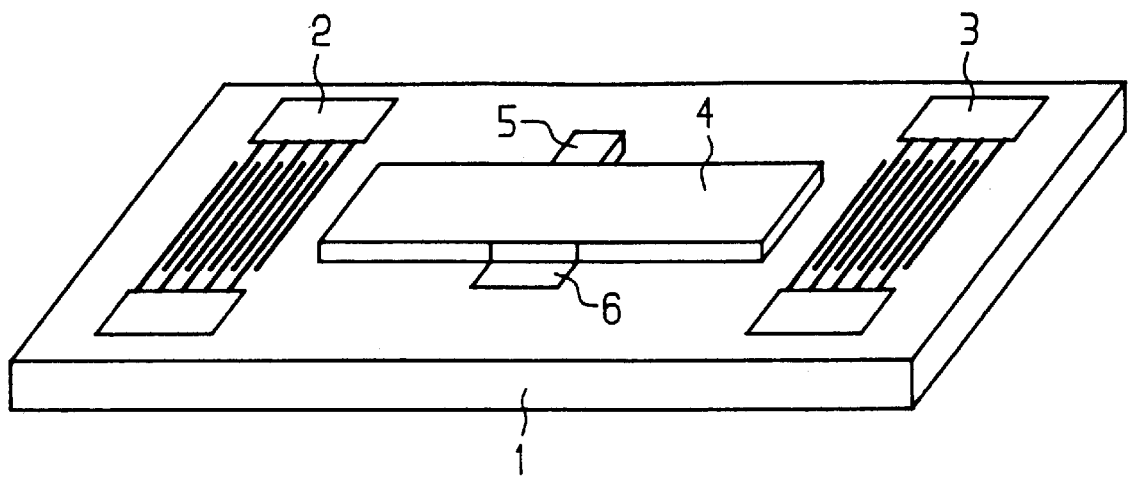
FIG. 1 is a diagrammatic, perspective view of a component according to the invention, in the form of a delay line having a transit time which can be tuned electrically.

In general terms, the present invention creates the possibility of realizing voltage-controlled maximum frequency components which are fully integrated into a semiconductor layer structure and can be operated in the range up to several Gigahertz, through the interaction of acoustical surface waves with an electron channel that is tunable in its electrical conductivity. This frequency range is technologically of major importance particularly in conjunction with mobile radio and mobile telephone traffic. The basis of the invention is to vary the transit time or speed of an acoustical surface wave by field effect, which is realized either directly in a piezoelectric semiconductor system or in a hybrid system including a piezoelectric element and a semiconductor layer structure which in that case is then not necessarily piezoelectric. In contrast to already known systems, the tunability is based on a direct intrinsic interaction of an acoustical surface wave with a quasi-two-dimensional electron system in a semiconductor structure.

The charge carrier density in this quasi-two-dimensional electron system can be adjusted in a targeted way through a gate voltage by field effect. As a result, at the same time, the conductivity per unit of surface area of the quasi-two-dimensional electron system is varied within wide limits. The interaction of the acoustical surface wave with the quasi-two-dimensional electron system leads to a damping of the acoustical surface wave and to a change in the speed of sound, both of which depend directly on the conductivity of the quasi-two-dimensional electron system.

The semiconductor structure which is employed may be chosen to be fully compatible with structures on which maximum frequency transistors for the frequency range in question can be produced. As a result, all of the amplification and control electronics can be fully integrated on a single chip without additional expense.

Structures according to the invention are also fully compatible with the present highly advanced technology of high-frequency signal processing with the aid of components that function with acoustical surface waves. It is therefore possible according to the invention to realize quite complex functions on a chip made by planar technology by integrating components that function with acoustical surface waves in semiconductor systems which are compatible with high-frequency electronics, and by utilizing an intrinsic interaction mechanism.

In components according to the invention, the chip-compatibility and VLSI-compatibility of the operating voltages that are used as well as the blocking currents that occur because of the completely different fundamental principle are negligible, and thus the component can be controlled with extremely low power. Moreover, the maximum interaction between acoustical surface waves and quasi-two-dimensional electron systems is within wide limits and in contrast to the above-described elements based on volume effects is not dependent on the frequency of the surface wave, so that it is even conceivable for components operating according to the invention, with the same functional tunability, to be operated simultaneously at different frequencies.

Referring now to the figures of the drawings in detail and first, particularly, to FIG. 1 thereof, there is seen a diagrammatic, perspective view of a component according to the invention, in the form of an electrically tunable delay line operating with acoustical surface waves and having two interdigital transducers 2 and 3 on a piezoelectric substrate 1 which are, for instance, one input and one output interdigital transducer of the delay line. A quasi-two-dimensional electron system 4 is provided in a travel path of an acoustical surface wave between the two interdigital transducers 2 and 3. The electron system 4 has one ohmic contact 5 for that system and one contact 6 for a non-illustrated field electrode.

As already noted above, the transit time or speed of the acoustical surface wave in the travel path between the interdigital transducers 2 and 3 can be controlled by field effect, through the use of a non-illustrated field electrode on the contact 6. This opens up many possible applications, which are based on varying the speed of the acoustical surface wave by field effect. This may involve, for instance, the delay line already mentioned, or voltage-controlled oscillators, resonators, voltage sensors, or sensors for variables other than electrical voltages.

There are many possibilities for the practical realization of components according to the invention.

According to another feature of the invention, the piezoelectric substrate 1 and the quasi-two-dimensional electron channel 4 of FIG. 1 are combined in a single piezoelectric semiconductor structure. Possible examples of piezoelectric semiconductor materials are the binary, ternary and quaternary III–V or II–VI compounds that are known per se, heterostructures or superstructures of them. GaAs, GaAsP, indium antimonide, or indium gallium arsenide can be mentioned as special examples for such semiconductor materials.

According to a further feature of the invention, the piezoelectric substrate 1 and the quasi-two-dimensional electron channel 4 of FIG. 1 may be constructed as a hybrid structure of a piezoelectric material and a semiconductor structure. Either the semiconductor structure containing the electron channel may be applied to a piezoelectric substrate, or a piezoelectric material may be applied to a semiconductor structure containing the electron channel. All of the materials used in the industry for components operating with acoustical surface waves may be considered as materials for the piezoelectric substrate, such as lithium tantalate, lithium niobate, quartz or zinc oxide. All of the materials used in the semiconductor industry may be considered as materials for the semiconductor structure containing the electron channel, such as the aforementioned compound semiconductors, silicon, germanium, semiconducting polymers or silicon carbide.

Figure 2:
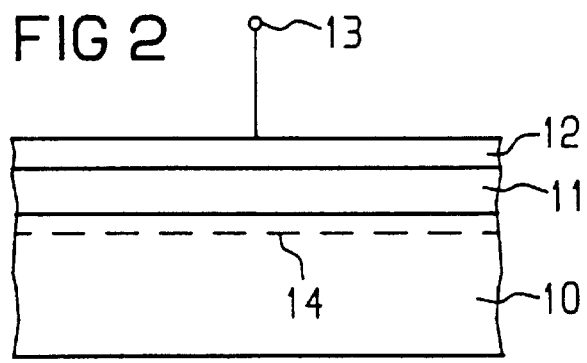
FIG. 2 is a fragmentary, sectional view of a first embodiment of an electron channel that is tunable in its electrical conductivity by field effect.
Figure 3:
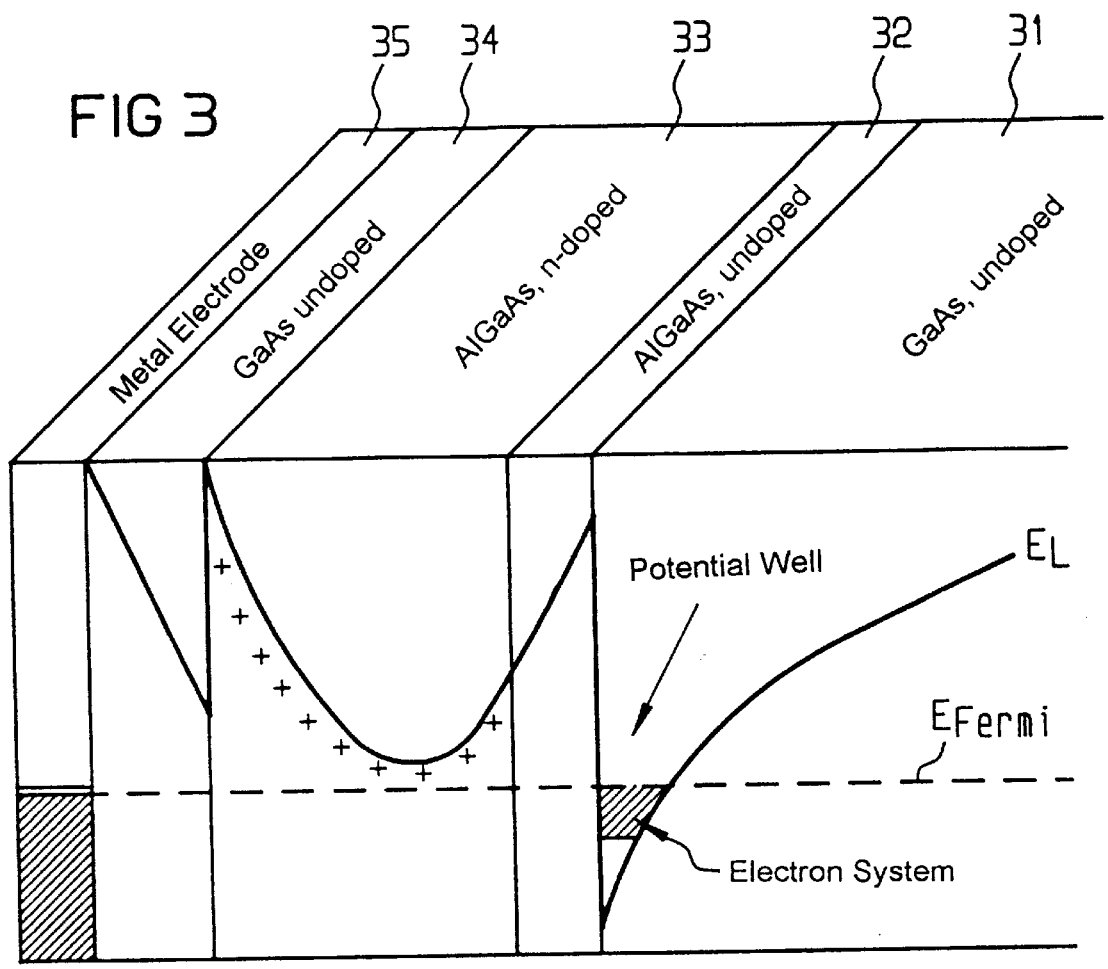
FIG. 3 is a view of a conduction band course of a typical $GaAs-Al_xGa_{1-x}As$ heterostructure.

Two possible embodiments for a quasi-two-dimensional electron system are shown in FIGS. 2 and 3.

FIG. 2 shows an embodiment of a semiconductor heterostructure. A doped semiconductor layer 11, for instance of ternary AlGaAs is applied on a semiconducting substrate 10, for instance of GaAs, thus forming a semiconducting heterostructure. A field electrode 12 with an electrical terminal 13 is applied to the layer 11. A quasi-two-dimensional electron system 14 is constructed in the substrate 10 and is controllable in its conductivity through a voltage at the terminal 13 of the field electrode.

Through the use of the aforementioned embodiment of the semiconductor heterostructure, a course of a valence band and a conduction band typical for a typical heterostructure results. A potential well for a small-sized electron system develops in that course.

FIG. 3 illustrates a course of a conduction band of a typical GaAs-Al$_x$Ga$_{x-1}$As heterostructure with a layer sequence shown as follows from right to left in the drawing: an undoped GaAs layer 31, an undoped AlGaAs layer 32, an n-doped AlGaAs layer 33, an undoped GaAs layer 34 and a metal electrode 35. The resultant conduction band edge or conduction band course is indicated by reference symbol $E_L$. The Fermi level is shown in dashed lines and indicated by reference symbol $E_{fermi}$.

A potential well according to the invention occurs in the undoped GaAs layer 31 on the side of the undoped AlGaAs layer 32, and the quasi-two-dimensional electron system forms in this well.

Figure 4:
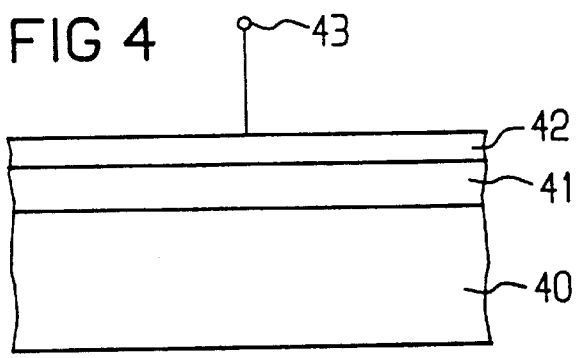
FIG. 4 is a fragmentary, sectional view of a second embodiment of an electron channel that is tunable in its electrical conductivity by field effect.

In the embodiment of FIG. 4, a field-effect-controllable electron channel or a quasi-two-dimensional electron system is formed in a MISFET structure. In particular, an MIS diode is formed by a semiconductor layer 40, an insulator layer 41 and a field electrode 42 located over the insulator layer 41 and having an electrical terminal 43. The semiconductor layer 40 may be silicon and the insulator layer 41 may be silicon dioxide, for instance.

Within the scope of the invention, a quasi-two-dimensional electron system or an electron channel that is controllable in its electrical conductivity by field effect can be realized not only by configurations such as those shown in FIGS. 2–4. For instance, a realization is also possible through the use of a polymer field effect structure that is known per se but not shown separately in the drawings.

Figure 5:
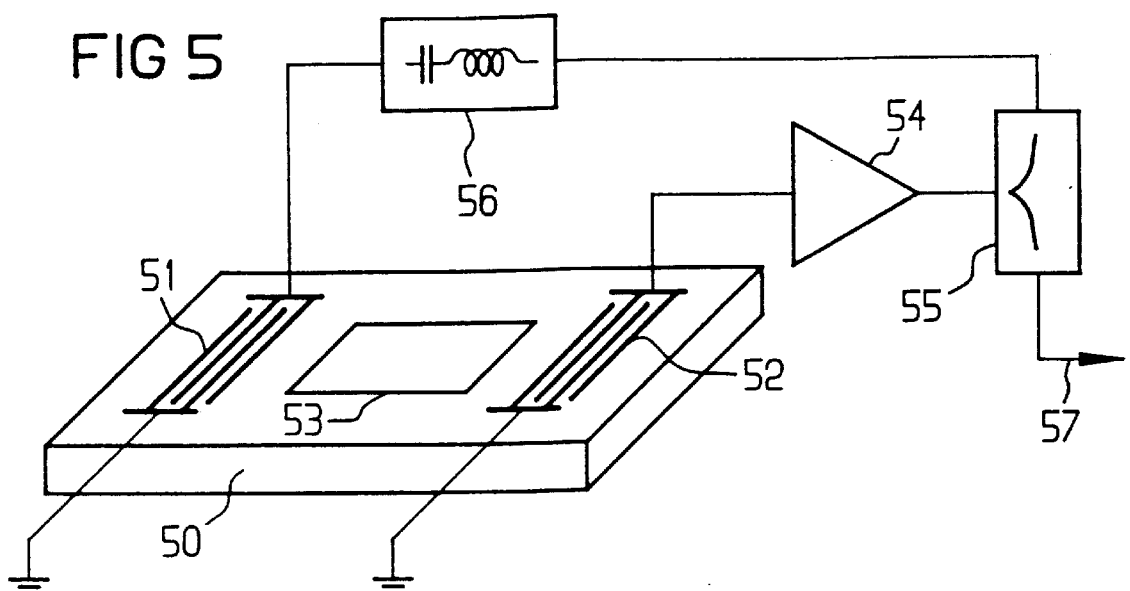
FIG. 5 is a basic schematic circuit diagram of an oscillator circuit using a component according to the invention shown in a perspective view.

FIG. 5 schematically and diagrammatically shows a voltage-controlled oscillator, as an exemplary embodiment of an application of a component according to the invention. The component of the invention, as in the embodiment of FIG. 1, is formed by a piezoelectric substrate 50 with two interdigital transducers 51 and 52 located thereon and an electron channel 53 which is disposed in a travel path of an acoustical surface wave between the interdigital transducers 51 and 52 and is controllable by field effect through a gate voltage which is applied. A feedback circuit between the two interdigital transducers 51 and 52 is formed by a high-frequency amplifier 54, a power distributor 55 and a band-pass filter 56. The oscillator output signal can be picked up at an output 57 of the power divider 55.

Figure 6:
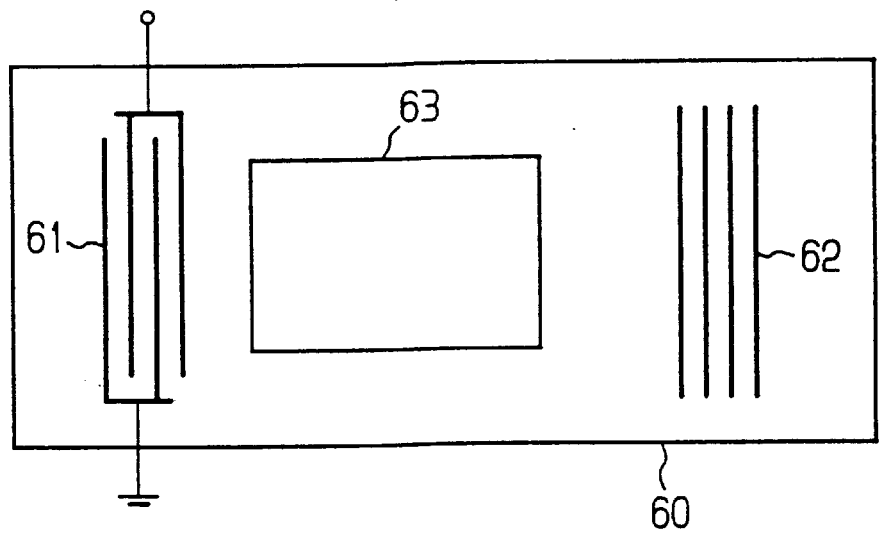
FIG. 6 is a basic plan view of an electrically tunable resonator using a component according to the invention.

FIG. 6 shows an embodiment of a resonator operating with acoustical surface waves, using a component according to the invention. An interdigital transducer 61, a reflector 62 and an electron channel 63 in a travel path of an acoustical surface wave between the interdigital transducer 61 and the reflector 62, are provided on a piezoelectric substrate 60. The electron channel 63 has a conductivity which is controllable by field effect. With such a resonator, it is also possible to assign the electron channel 63 with controllable electrical conductivity at least partially to the interdigital transducer 61 or the reflector 62 as well. As a result thereof, the electroacoustical interactions in the form of electrical and acoustical reflections can be varied accordingly.

A component according to the invention can also be used as a voltage sensor. The magnitude of a voltage applied to the electron channel having an electrical conductivity which is controllable by field effect can be measured through the transit time of an acoustical surface wave.

Detectors for other than electrical voltages are also realizable. For instance, reference may be made to gas sensors that are known per se, which however function solely with acoustical surface waves and that can be expanded using electron systems of the invention.

Finally, reference is also made to especially favorable production possibilities through the use of the lift-off technique that is known per se, as it is described, for instance, in the publication entitled: 1995 ultrasonics symposium, pp. 401–404.

I claim:

1. An acoustical-electronic component operating with acoustical surface waves, comprising:
   a piezoelectric substrate in which an acoustical surface wave is guided;
   a first interdigital transducer provided on said piezoelectric substrate;
   a second interdigital transducer provided on said piezoelectric substrate, the acoustical surface wave being guided along a travel path between said first interdigital transducer and said second interdigital transducer;
   a quasi-two-dimensional electron system disposed on said piezoelectric substrate in the travel path of the acoustical surface wave and interacting with the acoustical surface wave, said quasi-two-dimensional electron system having an electrical conductivity and being provided with an ohmic contact; and
   a field effect electrode tuning the electrical conductivity of said quasi-two-dimensional electron system substantially loss-free and without a charge transfer along the travel path by voltage-control for varying a transit time of the acoustical surface wave between said first interdigital transducer and said second interdigital transducer.

2. The component according to claim 1, wherein said piezoelectric substrate and said quasi-two-dimensional electron system are combined in a piezoelectric semiconductor structure.

3. The component according to claim 2, wherein said piezoelectric semiconductor structure is formed of a material selected from the group consisting of a binary, ternary or quaternary III–V compound or II–VI compound, a heterostructure or a superlattice structure thereof.

4. The component according to claim 3, wherein said material of said piezoelectric semiconductor structure is GaAs.

5. The component according to claim 3, wherein said material of said piezoelectric semiconductor structure is GaAsP.

6. The component according to claim 3, wherein said material of said piezoelectric semiconductor structure is indium antimonide.

7. The component according to claim 3, wherein said material of said piezoelectric semiconductor structure is indium gallium arsenide.

8. The component according to claim 1, wherein said piezoelectric substrate and said quasi-two-dimensional electron system are constructed as a hybrid structure including a piezoelectric material and a semiconductor structure.

9. The component according to claim 8, wherein said semiconductor structure containing said quasi-two-dimensional electron system is constructed on said piezoelectric substrate.

10. The component according to claim 9, wherein said piezoelectric substrate is formed of a material selected from the group consisting of lithium tantalate, lithium niobate, quartz and zinc oxide.

11. The component according to claim 8, wherein said semiconductor structure containing said quasi-two-dimensional electron system is formed of a material selected from the group consisting of compound semiconductors, silicon, germanium, semiconducting polymers and silicon carbide.

12. The component according to claim 8, wherein said piezoelectric material is applied to said semiconductor structure containing said quasi-two-dimensional electron system.

13. The component according to claim 1, wherein said quasi-two-dimensional electron system is controllable in its electrical conductivity by field effect is formed of a semiconductor heterostructure.

14. The component according to claim 13, wherein said semiconductor heterostructure is formed by semiconductor layers with different band spacing between a valence band and a conduction band.

15. The component according to claim 14, wherein said semiconductor heterostructure is formed by a gallium arsenide layer and a gallium arsenite layer grown thereon and doped with aluminum.

16. The component according to claim 1, wherein said quasi-two-dimensional electron system is controllable in its electrical conductivity by field effect is constructed in a MISFET structure.

17. The component according to claim 16, wherein said MISFET structure is formed by a MIS diode.

18. A tunable delay line operating with acoustical surface waves, comprising:
   a component having a piezoelectric substrate, an input and an output interdigital transducer on said piezoelectric substrate, an acoustical surface wave being guided along a travel path between said input interdigital transducer and said output interdigital transducer, a quasi-two-dimensional electron system disposed on said piezoelectric substrate in the travel path of the acoustical surface wave and interacting with the acoustical surface wave, said quasi-two-dimensional electron system having an electrical conductivity and being provided with an ohmic contact, and a field effect electrode tuning the electrical conductivity of said quasi-two-dimensional electron system substantially loss-free and without a charge transfer along the travel path by voltage-control for varying a transit time of the acoustical surface wave between said input interdigital transducer and said output interdigital transducer.

19. A voltage sensor, comprising:
   a tunable delay line operating with acoustical surface waves and including a component having a piezoelectric substrate, an input and an output interdigital transducer on said piezoelectric substrate, the acoustical surface waves being guided along a travel path between said input interdigital transducer and said output interdigital transducer, a quasi-two-dimensional electron system disposed on said piezoelectric substrate in the travel path of the acoustical surface waves and interacting with the acoustical surface waves, said quasi-two-dimensional electron system having an electrical conductivity and being provided with an ohmic contact, and a field effect electrode tuning the electrical conductivity of said quasi-two-dimensional electron system substantially loss-free and without a charge transfer along the travel path by voltage-control for varying a transit time of the acoustical surface waves between said input interdigital transducer and said output interdigital transducer.

20. A frequency-determining element in a voltage-controlled oscillator, comprising:
   a tunable delay line operating with acoustical surface waves and including a component having a piezoelectric substrate, an input and an output interdigital transducer on said piezoelectric substrate, the acoustical surface waves being guided along a travel path between said input interdigital transducer and said output interdigital transducer, a quasi-two-dimensional electron system disposed on said piezoelectric substrate in the travel path of the acoustical surface waves and interacting with the acoustical surface waves, said quasi-two-dimensional electron system having an electrical conductivity and being provided with an ohmic contact, and a field effect electrode tuning the electrical conductivity of said quasi-two-dimensional electron system substantially loss-free and without a charge transfer along the travel path by voltage-control for varying a transit time of the acoustical surface waves between said input interdigital transducer and said output interdigital transducer.

21. A resonator operating with acoustical surface waves, comprising:

a component having at least one interdigital transducer and at least one reflector defining a travel path of an acoustical surface wave between said at least one interdigital transducer and said at least one reflector, a quasi-two-dimensional electron system disposed on said piezoelectric substrate in the travel path of the acoustical surface wave and interacting with the acoustical surface wave, said quasi-two-dimensional electron system having an electrical conductivity and being provided with an ohmic contact, and a field effect electrode tuning the electrical conductivity of said quasi-two-dimensional electron system substantially loss-free and without a charge transfer along the travel path by voltage-control for varying a transit time of the acoustical surface wave between said at least one interdigital transducer and said at least one reflector.

22. A resonator operating with acoustical surface waves, comprising:

a component including a first element having at least one interdigital transducer, and a second element having a reflector, at least one of said first and second elements being at least partially formed of a quasi-two-dimensional electron system, an acoustical surface wave being guided along a travel path between said at least one interdigital transducer and said reflector, said quasi-two-dimensional electron system interacting with the acoustical surface wave, said quasi-two-dimensional electron system having an electrical conductivity and being provided with an ohmic contact, and said component further including a field effect electrode tuning the electrical conductivity of said quasi-two-dimensional electron system substantially loss-free and without a charge transfer along the travel path by voltage-control for varying a transit time of the acoustical surface wave between said at least one interdigital transducer and said reflector.

23. A semiconductor sensor having an acoustical-electronic component operating with acoustical surface waves, comprising:

a piezoelectric substrate in which an acoustical surface wave is guided;

a first interdigital transducer provided on said piezoelectric substrate;

a second interdigital transducer provided on said piezoelectric substrate, the acoustical surface wave being guided along a travel path between said first interdigital transducer and said second interdigital transducer;

a quasi-two-dimensional electron system disposed on said piezoelectric substrate in the travel path of the acoustical surface wave and interacting with the acoustical surface wave, said quasi-two-dimensional electron system having an electrical conductivity and being provided with an ohmic contact; and a field effect electrode tuning the electrical conductivity of said quasi-two-dimensional electron system substantially loss-free and without a charge transfer along the travel path by voltage-control for varying a transit time of the acoustical surface wave between said first interdigital transducer and said second interdigital transducer;

at least one of said quasi-two-dimensional electron system and said substrate being utilized as a structure responding to a variable to be detected.

* * * * *